(12) United States Patent
Oguro et al.

(10) Patent No.: US 8,245,647 B2
(45) Date of Patent: Aug. 21, 2012

(54) SWITCHING FACILITY FOR CROSSED PATHS

(75) Inventors: Keisuke Oguro, Shiga (JP); Motohiro Fujita, Shiga (JP); Yuuya Takemoto, Shiga (JP)

(73) Assignee: Daifuku Co., Ltd., Osaka (JP)

( * ) Notice: Subject to any disclaimer, the term of this patent is extended or adjusted under 35 U.S.C. 154(b) by 323 days.

(21) Appl. No.: 12/724,688

(22) Filed: Mar. 16, 2010

(65) Prior Publication Data

US 2010/0242784 A1    Sep. 30, 2010

(30) Foreign Application Priority Data

Mar. 27, 2009   (JP) ................................. 2009-080333

(51) Int. Cl.
*E01B 25/00*   (2006.01)
(52) U.S. Cl. .................. 104/96; 104/99; 104/130.01
(58) Field of Classification Search ............... 104/172.4, 104/89, 91, 96, 99, 100, 103, 130.01, 93, 104/94, 95
See application file for complete search history.

(56) References Cited

U.S. PATENT DOCUMENTS

| | | | | |
|---|---|---|---|---|
| 1,094,026 | A | * | 4/1914 | Simmonds ...................... 104/35 |
| 3,707,921 | A | * | 1/1973 | Fort ............................... 104/99 |
| 4,094,252 | A | * | 6/1978 | Pater et al. ............... 104/130.01 |
| 5,616,964 | A | | 4/1997 | Peterson, Jr. |
| 6,655,297 | B2 | * | 12/2003 | Kawato et al. .................. 104/96 |
| 7,089,868 | B2 | * | 8/2006 | Kawato et al. ................ 104/103 |
| 2005/0204843 | A1 | | 9/2005 | Nishino et al. |

FOREIGN PATENT DOCUMENTS

| | | | |
|---|---|---|---|
| DE | 3900616 | * | 7/1989 |
| JP | 63165241 U1 | | 10/1988 |
| JP | 3-32602 | * | 3/1991 |
| JP | 09-323644 | * | 12/1997 |
| JP | 2000-059921 | * | 2/2000 |
| JP | 2002-087250 | * | 2/2002 |
| JP | 2006-319154 | * | 11/2006 |
| JP | 2007-039237 | * | 2/2007 |
| JP | 2007161025 A | | 6/2007 |

* cited by examiner

*Primary Examiner* — Mark Le
(74) *Attorney, Agent, or Firm* — The Webb Law Firm

(57) ABSTRACT

A path switching facility for crossed paths comprises: at least one article transport vehicle configured to travel along a first path and a second path that crosses the first path; a guide rail for guiding a guided roller of the article transport vehicle; a travel rail for guiding and supporting travel wheels of the article transport vehicle; a rotatable guide rail and a rotatable travel rail both located in a crossing area; a push operating portion provided to the article transport vehicle to push one of the rotatable guide rail and the rotatable travel rail; and, an operatively connecting device for coupling a rotation of the rotatable guide rail with a rotation of the rotatable travel rail.

9 Claims, 8 Drawing Sheets

FIG.5
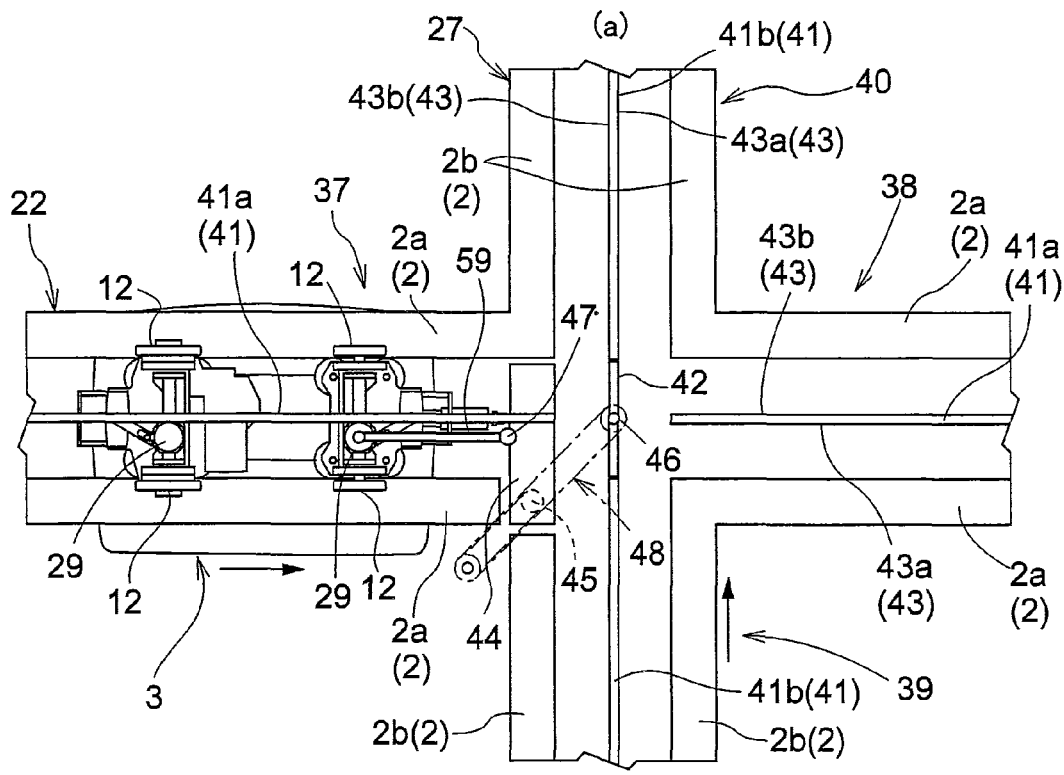
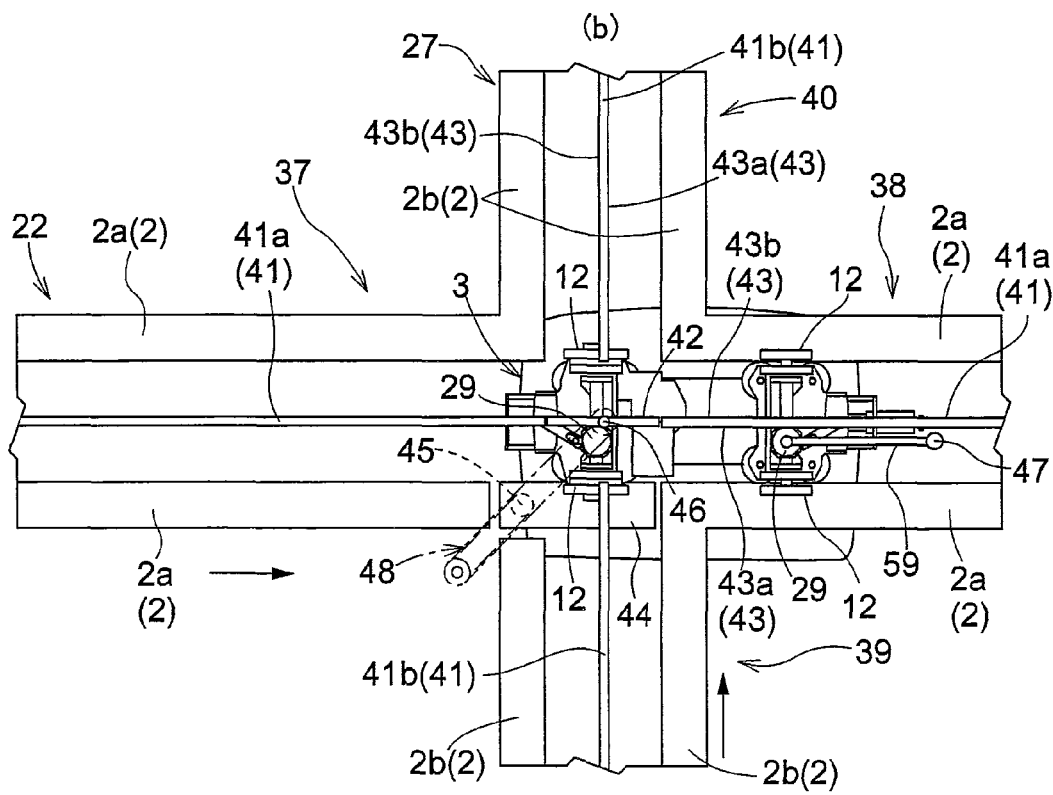

FIG.8
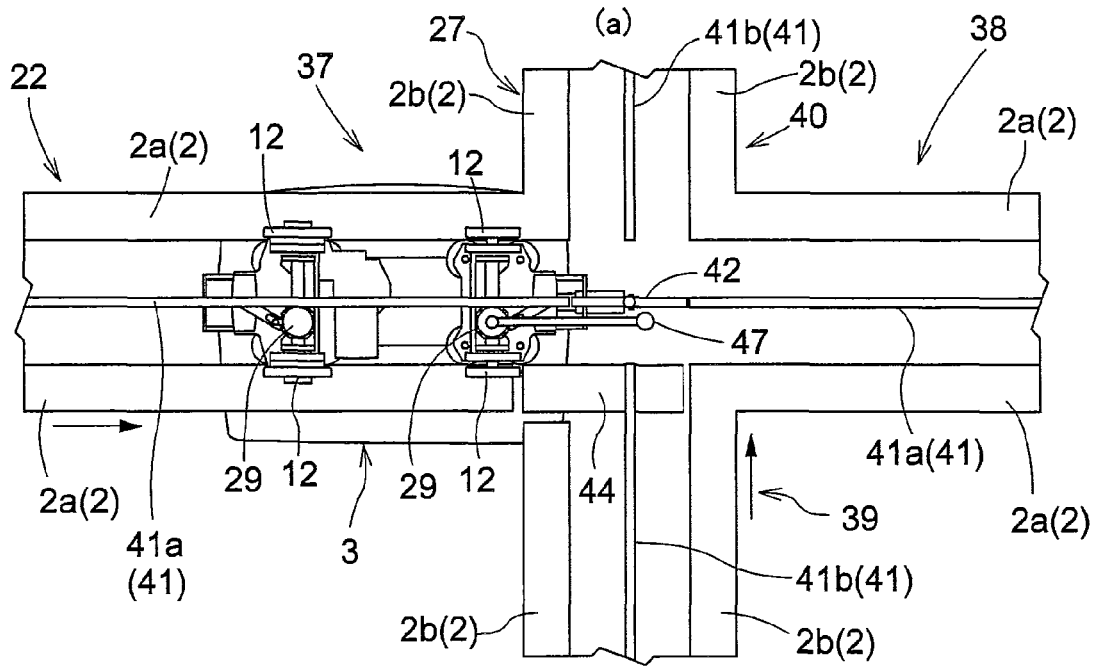
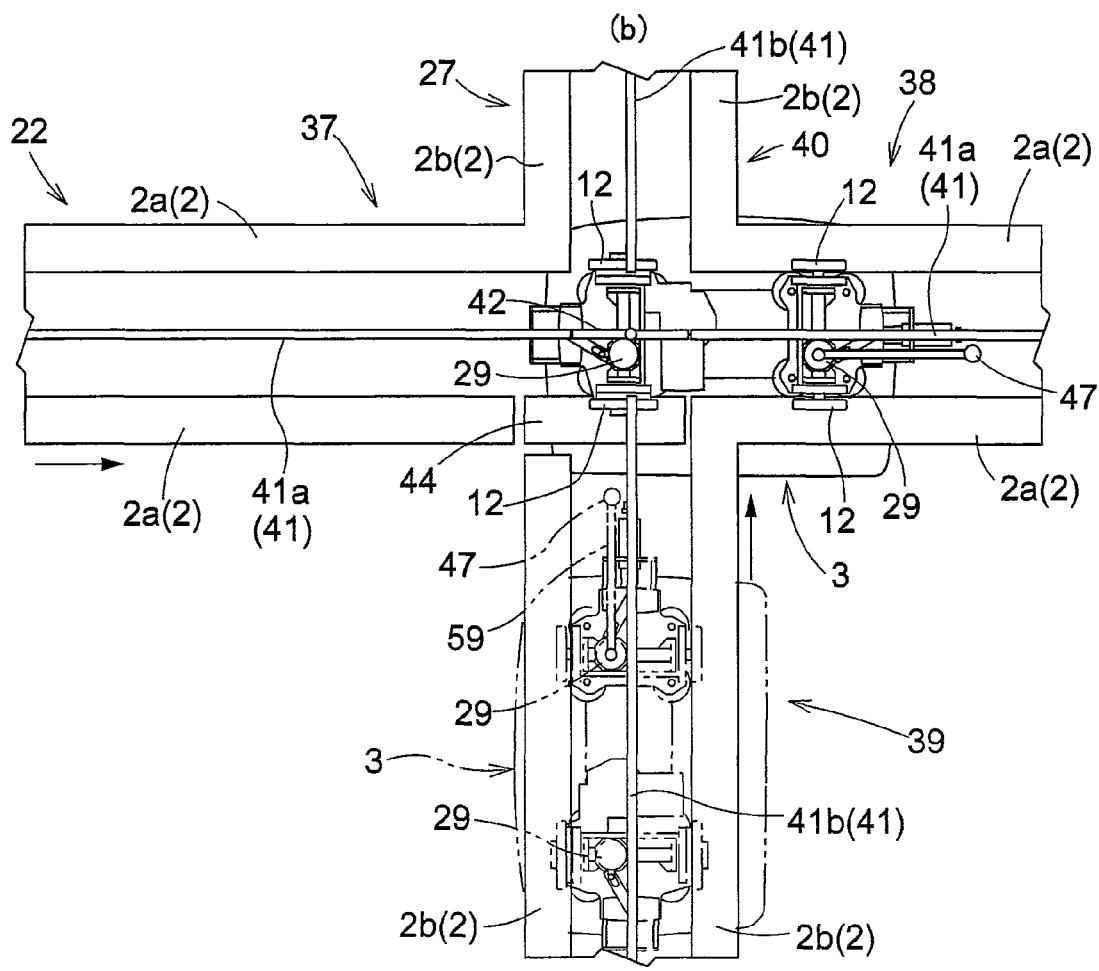

SWITCHING FACILITY FOR CROSSED PATHS

BACKGROUND OF THE INVENTION

1. Field of the Invention

The present invention relates to a switching facility for crossed paths provided in a crossing area where the first path and the second path cross each other for switching between a first switching state in which an article transport vehicle is caused to pass through the crossing area along the first path and a second switching state in which the article transport vehicle is caused to pass through the crossing area along the second path.

2. Description of the Related Art

In the switching facility for crossed paths described above, the article transport vehicle can pass through the crossing portion along the first path and the second path by switching the switching means to the first switching state when the article transport vehicle passes through the crossing portion along the first path, and by switching the switching means to the second switching state when the article transport vehicle passes through the crossing portion along the second path.

One conventional switching facility for crossed paths has a diverging crossing portion in which a primary path diverges into a first path and a second path. In this conventional facility, a guide rail for guiding a guided roller provided to an upper portion of the article transport vehicle, and a travel rail for guiding and supporting the travel wheels provided to a lower portion of the article transport vehicle are provided in each of an entrance portion of the primary path which is continues with the crossing portion, a first exit portion of the first path which is continuous with the crossing portion, and a second exit portion of the second path which is continuous with the crossing portion. In the crossing portion, a switchable guide rail is provided that can be switched between a first guiding position in which the switchable guide rail is continuous with the guide rails provided in the entrance portion and the first exit portion and a second guiding position in which the switchable guide rail is continuous with the guide rails provided in the entrance portion and the second exit portion and a switchable travel rail is provided that can be switched between a first travel position in which the switchable travel rail is continuous with the travel rails provided in the entrance portion and the first exit portion and a second travel position in which the switchable travel rail is continuous with the travel rails provided in the entrance portion and the second exit portion. And a switching means is provided with a switching actuator (for example, electric motor etc.). By actuating the switching actuator, the switching means can be switched into a first switching state in which the switchable travel rail is switched to the first travel position, and the switchable guide rail is switched to the first guiding position, and into a second switching state in which the switchable travel rail is switched to the second travel position, and the switchable guide rail is switched to the second guiding position (see, for example, JP publication No. H9-323644 (the patent document 1)).

And another conventional switching facility for crossed paths has a perpendicular crossing portion in which the first path and the second path cross each other perpendicularly. This conventional switching facility includes travel rails for guiding and supporting travel wheels in each of the first entrance portion (of the first path) which is continuous with the crossing portion, the first exit area (of the first path) which is continuous with the crossing portion, the second entrance portion (of the second path) which is continuous with the crossing portion, and the second exit portion (of the second path) which is continuous with the crossing portion. A rotatable travel rail is provided in the crossing portion and is rotatable about a vertical axis between a first travel position in which the rotatable travel rail is continuous with the travel rails provided in the first entrance portion and the first exit portion, and a second travel position in which the rotatable travel rail is continuous with the travel rails provided in the second entrance portion and the second exit portion. And switching means includes first rotation operation means that is pushed by the article transport vehicle as the article transport vehicle advances into the crossing portion to rotate the rotatable travel rail from the second travel position to the first travel position, and second rotation operation means that is pushed by the article transport vehicle as the article transport vehicle advances into the crossing portion to rotate the rotatable travel rail from the first travel position to the second travel position. First rotation operation means and second rotation operation means are provided to the crossing portion. The first rotation operation means rotates the rotatable travel rail to the first travel position to achieve a first switching state, and the second rotation operation means rotates the rotatable travel rail to the second travel position to achieve a second switching state. With each of the first rotation operation means and the second rotation operation means, as the vehicle advances into the crossing portion, the rotatable travel rail starts to be pushed by the article transport vehicle and an urging spring is compressed by the rotation of the rotatable travel rail. And when the article transport vehicle stops pushing, the rotation of the rotatable travel rail is continued by the urging force from the compressed urging spring to switch the travel position of the rotatable travel rail (see, for example, JP Publication No. H03-32602 (the patent document 2)).

In the facility described in the patent document 1, since a guide switching rail is provided in the crossing portion in addition to the travel switching rail, in addition to the fact that the travel wheels of the article transport vehicle are guided and supported by the travel switching rail, a guided roller provided to an upper portion of the article transport vehicle is also guided when the article transport vehicle passes through the crossing portion, ensuring a stable travel of the article transport vehicle, and smooth passage of the article transport vehicle through the crossing portion.

However, the facility described in the patent document 1 requires a switching actuator in the crossing portion for switching the travel switching rail between the first travel position and the second travel position. This tends to make the facility more complex because of, among other things, the wiring work for supplying electric power to the switching actuator, and because of the need to secure installation space for the switching actuator. And, in the facility which has a number of crossing portions, the switching actuator needs to be provided in each of the plurality of crossing portions, which tends to raise the cost of the facility.

In the facility described in the patent document 2, since the rotatable travel rail can be switched between the first travel position and the second travel position as the article transport vehicle advances into the crossing portion, there is no need to provide a switching actuator in the crossing portion for switching the rotatable travel rail between the first travel position and the second travel position. Therefore, compared with the facility described in the patent document 1, the configuration of the facility described in the patent document 2 can be simplified, and a reduction in cost etc. may be expected in the facility with a number of crossing portions.

However, in the facility described in the patent document 2, since only the rotatable travel rail is provided in the crossing portion, only the travel wheels of the article transport vehicle are guided and supported by the rotatable travel rail when the article transport vehicle passes through the crossing portion. This makes it more difficult to ensure stable travel of the article transport vehicle and smooth passage of the article transport vehicle through the crossing portion. And, since the rotatable travel rail is switched between the first travel position and the second travel position as the article transport vehicle advances into the crossing portion, a crossing portion requires both a first rotation operation means and a second rotation operation means, leading to a larger installation space and a more complex configuration of the facility.

Incidentally, in the facility described in the patent documents 2, in addition to the rotatable travel rail, it is conceivable to provide a crossing portion with a rotatable guide rail for guiding the guided roller provided, for example, in the upper portion of the article transport vehicle, such that the rotatable guide rail is rotatable about a vertical axis between a first guiding position in which the rotatable guide rail is continuous with the guide rails provided in a first entrance area and a first exit area, and a second guiding position in which the rotatable guide rail is continuous with the guide rails provided in a second entrance area and a second exit area. In this case, in order to switch the rotatable guide rail between the first guiding position and the second guiding position as the article transport vehicle advances into the crossing portion, two additional operation means must be installed in the crossing portion in addition to the first rotation operation means and the second rotation operation means, leading to a more complex configuration of the facility.

SUMMARY OF THE INVENTION

An object of the present invention is to provide a switching facility for crossed paths in which at least one of the problems of the conventional technology is alleviated.

A switching facility for crossed paths in accordance with the present invention comprises: a first path; a second path that crosses the first path in a crossing area; at least one article transport vehicle configured to travel along the first path and the second path, each of the at least one of the article transport vehicle having: a guided roller provided to an upper portion of the article transport vehicle to be rotatable about an axis extending in a vertical direction of the article transport vehicle; travel wheels provided to a lower portion of the article transport vehicle to be rotatable about an axis extending in a lateral direction of the article transport vehicle; a guide rail for guiding the guided roller of the article transport vehicle; a travel rail for supporting and guiding the travel wheels of the article transport vehicle, wherein the guide rail and the travel rail are provided in each of the first entrance area and the first exit area of the first path, and the second entrance area and the second exit area of the second path, each of the first entrance area, the first exit area, the second entrance area, and the second exit area being continuous with the crossing area; a rotatable guide rail located in the crossing area and rotatable about a vertical axis between a first position for guiding in which the rotatable guide rail is continuous with the guide rails provided in the first entrance area and the first exit area, and a second position for guiding in which the rotatable guide rail is continuous with the guide rails provided in the second entrance area and the second exit area; a rotatable travel rail located in the crossing area and rotatable about a vertical axis between a first position for travel in which the rotatable travel rail is continuous with the travel rails provided in the first entrance area and the first exit area, and a second position for travel in which the rotatable travel rail is continuous with the travel rails provided in the second entrance area and the second exit area; a push operating portion provided to each of the article transport vehicle and configured to push one of the rotatable guide rail and the rotatable travel rail from the first position into the second position, and from the second position into the first position as the article transport vehicle advances into the crossing area, operatively connecting means for coupling a rotation of the rotatable guide rail with a rotation of the rotatable travel rail such that when one of the rotatable guide rail and the rotatable travel rail is pushed by the push operating portion and rotated from the first position to the second position, the other of the rotatable guide rail and the rotatable travel rail is rotated from the first position to the second position, and such that when one of the rotatable guide rail and the rotatable travel rail is pushed by the push operating portion and rotated from the second position to the first position, the other of the rotatable guide rail and the rotatable travel rail is rotated from the second position to the first position.

With such a configuration, when the article transport vehicle advances into the crossing area along the first path, it does so with the travel wheels guided and supported by the travel rail provided in the first entrance area, and the guided roller guided by the guide rail provided in the first entrance area. And as the article transport vehicle advances into the crossing area, the push operating portion pushes, for example, the rotatable guide rail to rotate it from the second position for guiding to the first position for guiding, and the operatively connecting means causes the rotatable travel rail to rotate from the second position for travel to the second position for the travel with the rotation of the rotatable guide rail. Thus, as the article transport vehicle advances into the crossing area, the first switching state is achieved where the rotatable guide rail is in the first position for guiding and the rotatable travel rail is in the first position for travel. As a result, the article transport vehicle can travel with the travel wheels guided and supported by the rotatable travel rail and with the guided roller guided by the rotatable guide rail when the vehicle passes through the crossing area. And after passing through the crossing area, the article transport vehicle can travel with the travel wheels guided and supported by the travel rail provided in the first exit area and with the guided roller guided by the guide rail provided in the first exit area.

Also when the article transport vehicle advances into the crossing area along the second path, the second switching state is achieved where the rotatable guide rail is in the second position for guiding and the rotatable travel rail is in the second position for travel as the article transport vehicle advances into the crossing area because of the rotation of the rotatable guide rail by the push operating portion and the coupling of the rotation of the rotatable guide rail with the rotation of the rotatable travel rail by the operatively connecting means, similar to the case where the article transport vehicle advances into the crossing area along the first path.

Therefore, only the operatively connecting means for coupling the rotatable guide rail with rotation of the rotatable travel rail is required in addition to the rotatable guide rail and the rotatable travel rail in the crossing area. And it is not necessary to provide an actuator for switching the positions of the rotatable guide rail and the rotatable travel rail.

Accordingly, a switching facility for crossed paths is provided, which allows the article transport vehicles to pass the crossing area smoothly either along the first path or the second path without causing the configuration to become complex.

A person skilled in the art will be able to understand the beneficial features of the present invention from the disclosures in the specification and in the attached drawings.

BRIEF DESCRIPTION OF THE DRAWINGS

FIG. 5 is a plan view of a crossing portion, FIG. 8 shows an article transport vehicle passing through a crossing portion.

DESCRIPTION OF THE PREFERRED EMBODIMENTS

An embodiment of an article transport facility is described with reference to the attached drawings.

Figure 1:
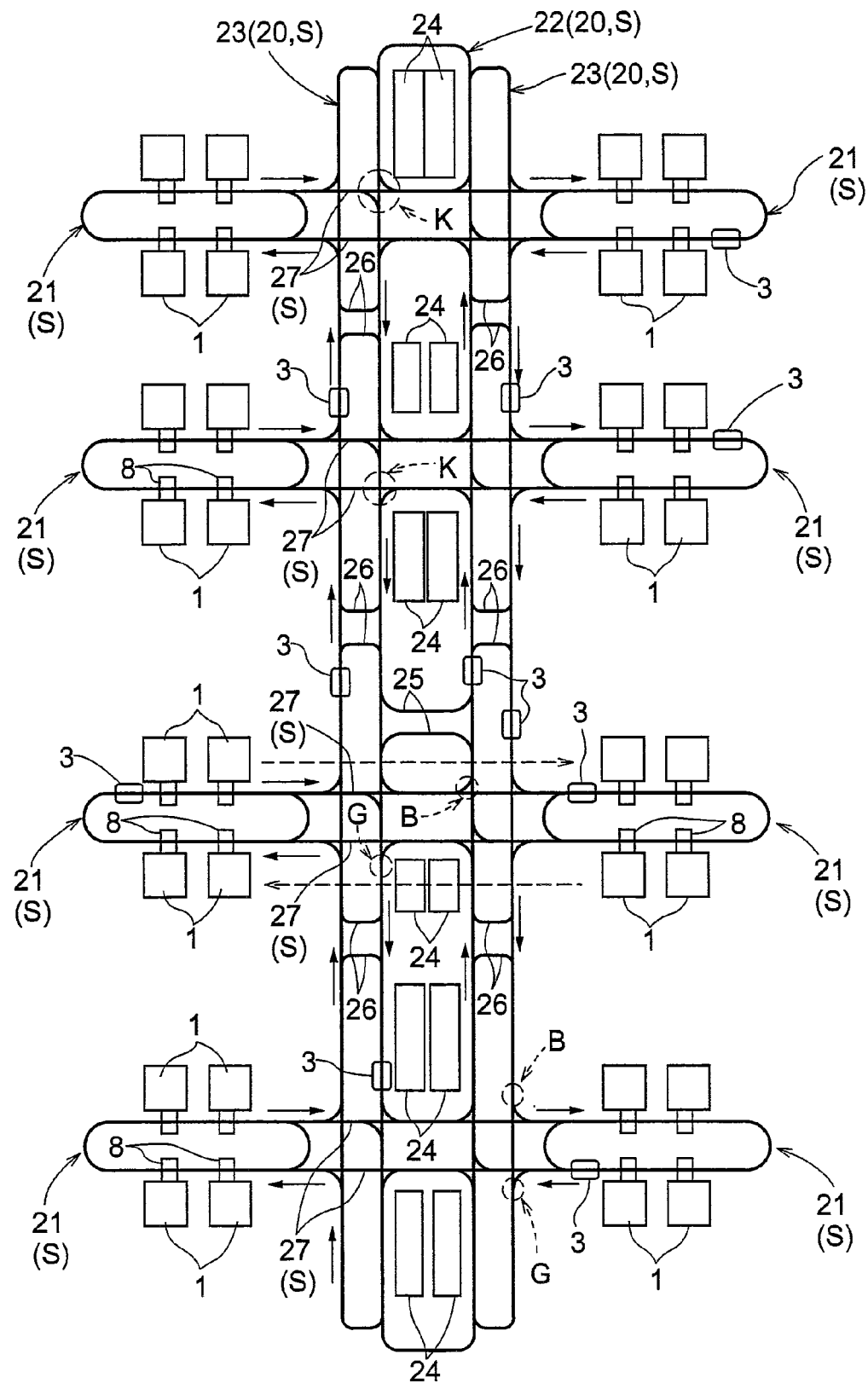
FIG. 1 is a plan view of the article transport facility in its entirety.

As shown in FIG. 1, the present article transport facility is provided with a plurality of article processors 1 for processing semiconductor substrates. Rails 2 are installed on the ceiling side, or to the ceiling, such that each of the rail 2 extends along and passes by these article processors 1 to form a travel path S. A plurality of article transport vehicles 3, of the type that is suspended from the ceiling and which can travel in one direction along a travel path S, are provided. The article transport facility is configured such that the article transport vehicles 3 transport the articles 4 (i.e. containers for storing semiconductor substrates) among the plurality of article processors 1. Each rail 2 for the vehicles to travel on (travel rail for short) is fixedly installed to the ceiling with rail brackets 5 (see FIG. 2).

Figure 2:
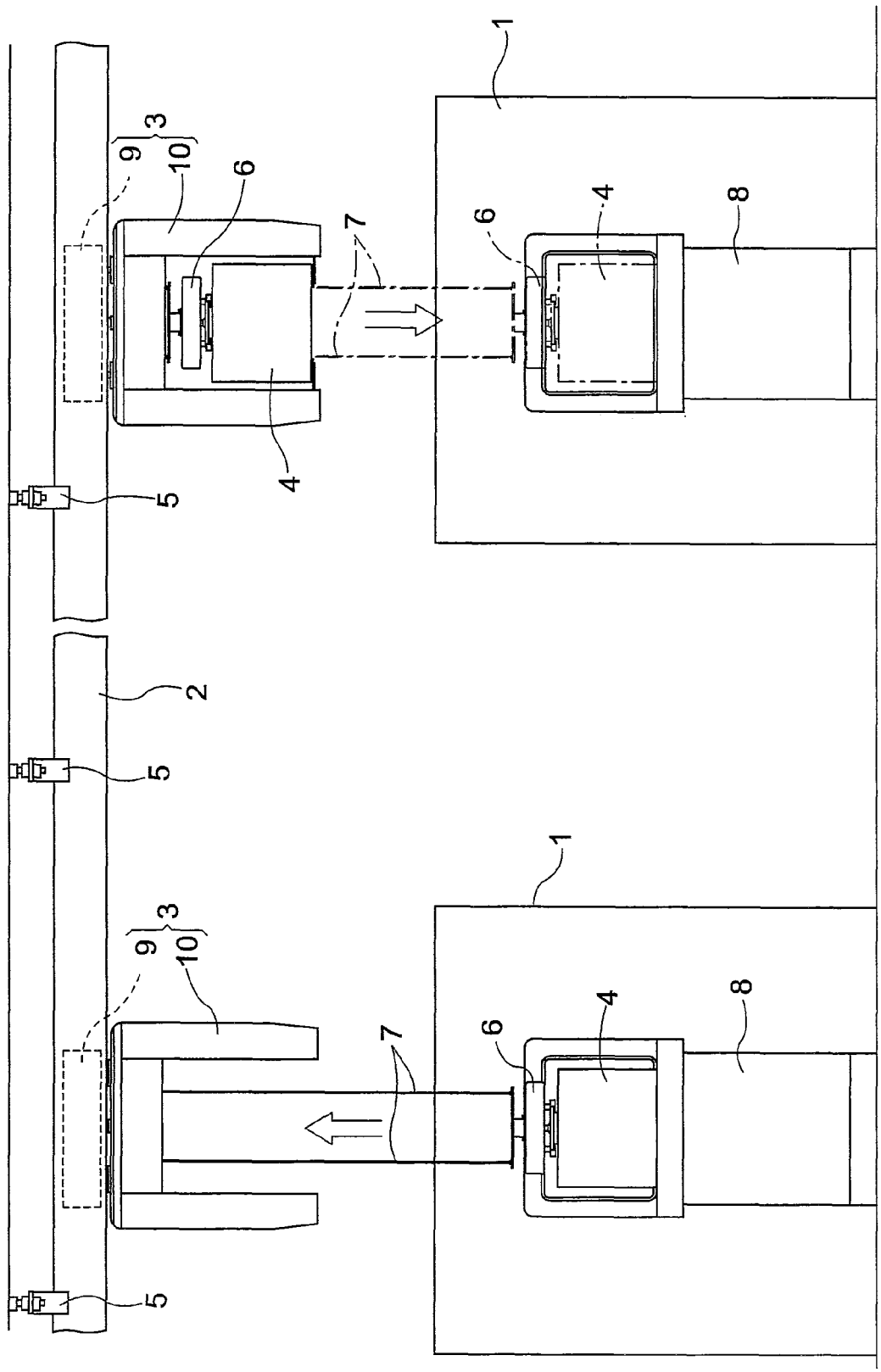
FIG. 2 is a side view of a part of an article transport facility.

As shown in FIG. 2, each article transport vehicle 3 has a grip portion 6 which holds and suspends an article 4 and which can be raised and lowered. With the article transport vehicle 3 standing still, the grip portion 6 can be raised and lowered, by taking in or letting out the wire 7, between a raised position in which the grip portion 6 approaches the article transport vehicle 3 and a lowered position in which an article is transferred to and from the article transfer station 8 (i.e. an article transport location) installed at a level below the article transport vehicle 3. It is also possible to use, for example, a belt in place of the wire 7.

Incidentally, the situation in which the grip portion 6 descends to the lowered position from the raised position is shown in one part of FIG. 2 while the other part shows the situation where the grip portion 6 is raised from the lowered position to the raised position.

A station 8 is a support platform for supporting an article 4. And each station 8 is configured to receive, from the article transport vehicle 3, an article 4 to which a predetermined processing is to be performed by the article processor 1 and to deliver, to the article transport vehicle 3, an article 4 to which a predetermined processing has been performed by the article processor 1. A station 8 is provided to each of the plurality of article processors 1.

The article transport vehicle 3 is configured to travel along the travel rail 2 with the grip portion 6 in the raised position, and to deliver and receive the article 4 to and from the station 8 by raising and lowering the grip portion 6 between the raised position and the lowered position while remaining still at a stop position corresponding to a station 8, among the plurality of stations 8, to or from which an article 4 is to be transferred.

The article transport vehicle 3 includes a travel drive member 9 which runs on the travel rail 2, and an article support portion 10 suspended and supported by the travel drive member 9 so as to be located under the travel rail 2.

Figure 3:
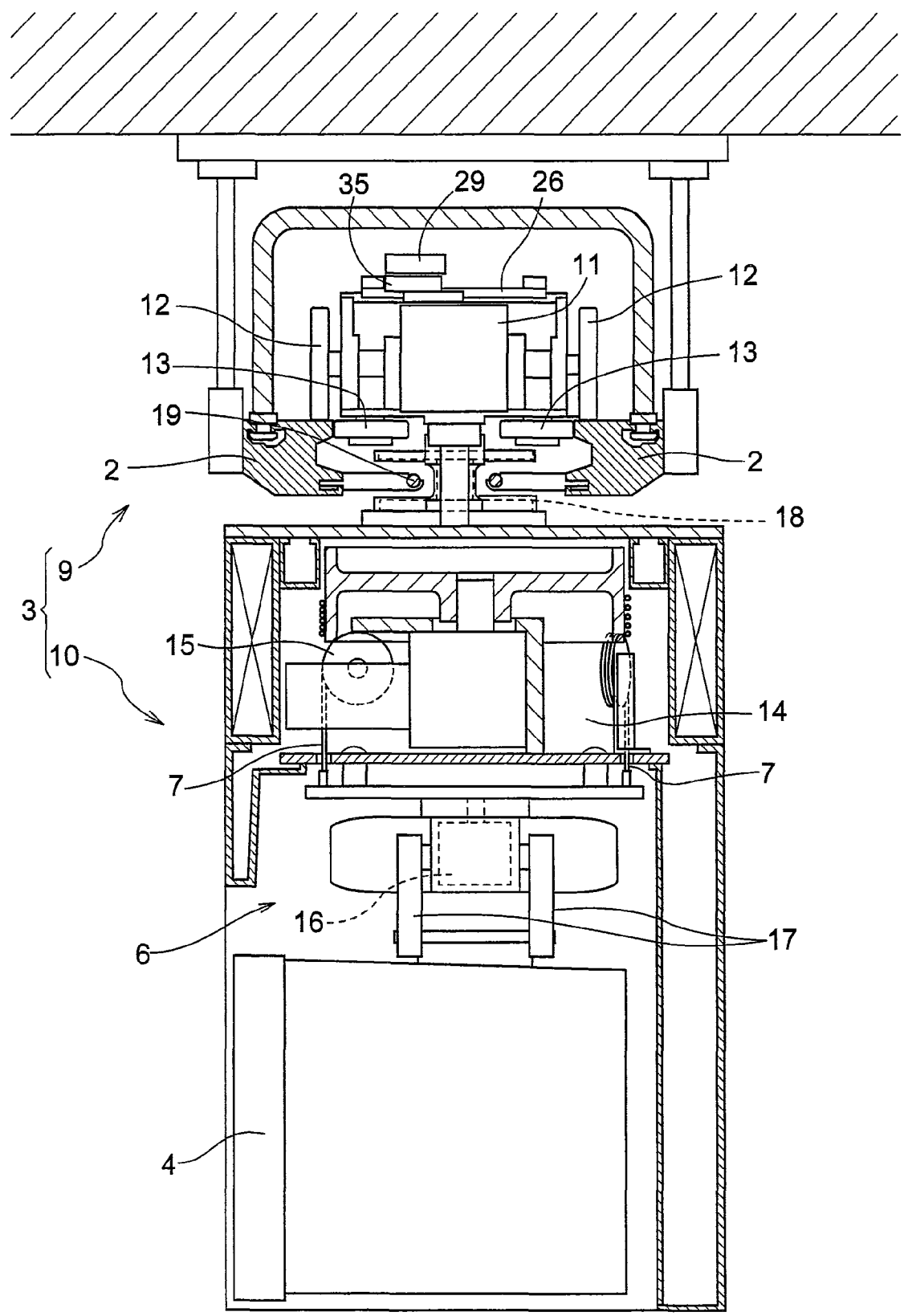
FIG. 3 is a sectional drawing of the article transport vehicle as viewed in the travel direction.

As shown in FIG. 3, the travel drive member 9 includes travel wheels 12 which are rotatably actuated by a drive motor 11 and each of which rolls on a respective horizontal upper surface of the pair of travel rails 2, and travel guiding wheels 13 each of which abuts corresponding one of vertically oriented and opposing side surfaces of the pair of rails 2. And the article transport vehicle 3 is configured to be guided by and to travel along the travel rail 2 with the travel wheels 12 rotated about an axis extending laterally of the article transport vehicle 3 by the drive motor 11, and with the travel guiding wheels 13, which are freely rotatable about respective vertical axes, being guided through contact with the pair of rails 2.

Figure 4:
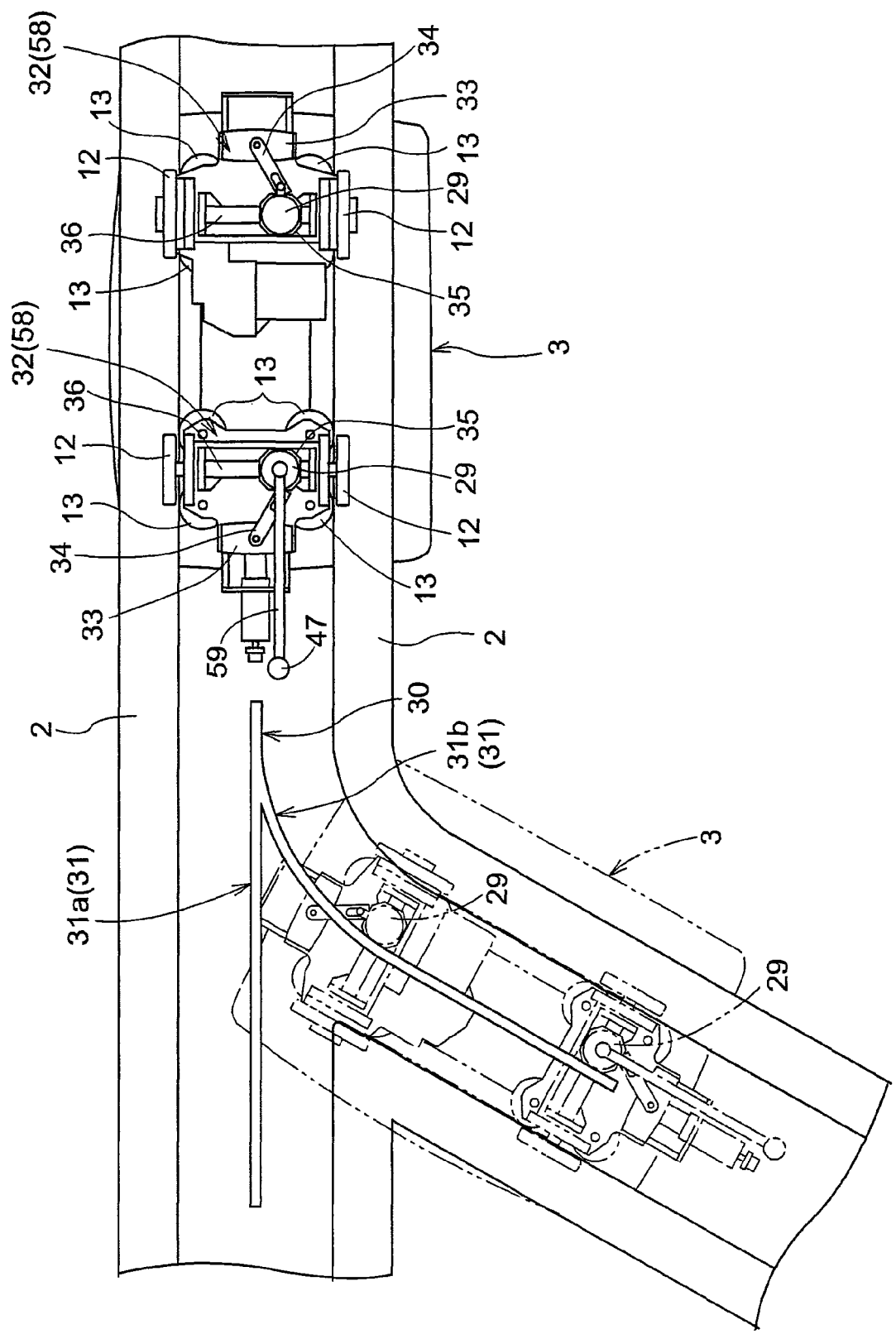
FIG. 4 is a plan view of a diverging portion.

As shown in FIG. 4, a travel wheel 12 is arranged at each lateral end of the article transport vehicle 3 forming a pair of wheels, and two such pairs of travel wheels 12 are spaced apart by a distance in the fore and aft direction of the article transport vehicle 3, with a total of four travel wheels 12 provided to each vehicle 3. Two travel guiding wheels 13 are provided at each lateral end of the article transport vehicle 3, and two such sets of travel guiding wheels 13 are provided to be spaced apart in the for and aft direction of the article transport vehicle 3 with a total of eight travel guiding wheels 13.

As shown in FIG. 3, the article support portion 10 includes a rotation drum 15 which winds the wire 7 and is rotated by a motor 14 for raising and lowering, and the grip portion 6 suspended and supported with the wire 7. The grip portion 6 has a gripper 17 that may be switched by means of a motor 16 between a gripping posture in which the article 4 is gripped, and the grip release posture in which the grip is released. And the grip portion 6 and the article 4 gripped thereby are raised and lowered by rotating the rotation drum 15 with the motor 14 for raising and lowering. The article 4 may be gripped or released by the switchover operation of the gripper 17 by means of the motor 16 for gripping.

The power receiving coil 18 is provided to the article transport vehicle 3 to be located between the pair of rails 2. And alternating current is applied to the electric supply line 19 arranged along the travel rail 2 to generate magnetic field, which in turn generates electric power required by the article transport vehicle 3 in the power receiving coil 18. Thus electric power is supplied to the article transport vehicle 3 without contact. Incidentally, the electric supply line 19 is supported to the travel rail 2 so as to be located between the pair of rails 2.

While the travel path S along which the article transport vehicles 3 run is defined by the rails 2 in this article transport facility, as shown in FIG. 1, the travel path S includes a loop-shaped primary path 20, loop-shaped secondary paths 21, and first connecting paths each of which connects the primary path 20 and a secondary path 21, and which enables diverging travel of the article transport vehicles 3 from the primary path 20 to the secondary path 21 and converging travel from the secondary path 21 to the primary path 20. Loop-shaped means in this context to substantially form a loop or a closed curve.

[Primary Paths]

The primary path 20 includes a loop-shaped first primary path 22 having a pair of straight line portions facing each other and a pair of curved portions each of which connects an end portion and beginning portion of the pair of straight line portions, and second primary paths 23 connected to the first primary path 22 such that the second primary paths 23 are located outwardly of the loop of and to one and the other lateral sides of the first primary path 22 and such that the article transport vehicles 3 can travel or diverge from and switch paths to the first primary path 22.

A plurality of storage stations 24 for storing articles 4 stand erect on the floor within the loop of the first primary path 22 with storage stations 24 separated from each other in the direction in which the straight line portions of the first primary paths 22 extend. The first primary path 22 is thus arranged such as to extend by and along a plurality of storage stations 24. Thus, the storage stations 24 are provided to serve as article transport locations on the inward-side of the first primary path 22.

Although not shown, each storage station 24 has a plurality of storage units that are configured to support the articles 4 and that are arranged in both the vertical and lateral directions. And each storage station 24 has a storage and retrieval portion where articles 4 are transferred to and from the article transport vehicles 3 and an article transport device which can transport the article 4 between the storage and retrieval portion and each storage unit. A target stop position for storing and retrieving articles 4 by the article transport vehicles 3 is set up in the first primary path 22 for the storage and retrieval portion for each of the plurality of storage stations 24. The article transport vehicle 3 raises and lowers the grip portion 6 while remaining still at a target stop position to transfer an article 4 to and from a storage station 24.

First shortcut paths 25 for connecting the mutually-facing straight line portions of the first primary path 22 are provided so that the article transport vehicles 3 may, using the first shortcut path 25, switch paths to the opposite straight line portion while traveling in a straight line portion of the first primary path 22.

The second primary path 23 is arranged on the outside of the loop of the first primary path 22 and on both lateral sides, that is, one side and the other side of the first primary path 22. Each of the second primary path 23 has a straight line portion parallel to the straight line portion of the first primary path 22, a connecting portion which connects a part in the area of the beginning portion of the straight line portion of the first primary path 22 to the beginning portion of the straight line portion of the second primary path 23, and a connecting portion which connects the end portion of the straight line portion of the second primary path 23 to a part in the area of the end portion of the straight line portion of the first primary path 22. Thus, a loop-shaped path is formed by the straight line portions of the second primary path 23 and the first primary path 22. In addition, second shortcut paths 26 are provided to allow the article transport vehicles 3 to freely switch paths between an intermediate location in the straight line portion of the second primary path 23 and an intermediate location in the straight line portion of the first primary path 22.

[Secondary Paths]

A plurality of secondary paths 21 (for example, four of them on either lateral side in FIG. 1) are provided (laterally) outwardly of the second primary paths 23 such that the secondary paths 21 are arranged generally parallel to and spaced apart from each other in the traveling direction of the article transport vehicle 3 in the second primary path 23. The secondary paths 21 are provided or located on both the one and the other lateral sides of the primary path 20 with both located outside of the second primary path 23. The secondary paths 21 are arranged to one and the other sides of the primary path 20 at such locations that each secondary path extending on one lateral side of the primary path 20 faces a corresponding secondary path extending on the other side of the primary path 20 with the primary path 20 located therebetween.

Each of the secondary path 21 has a straight line portion extended away from the primary path 20, and a straight line portion facing the first straight portion and extending toward the primary path 20 with the straight portions extending by and along a plurality of stations 8. And each of the secondary path 21 forms a loop having a pair of the straight line portions and a pair of curved portions each connecting an end portion and beginning portion of the pair of straight line portions. Target stop positions, each for transferring the articles 4 between each of the plurality of stations 8 and the article transport vehicle 3, are provided along the secondary path 21. The article transport vehicle 3 raises and lowers the grip portion 6 while remaining still at a target stop position to transfer an article 4 to and from the corresponding station 8.

[First Connecting Paths]

First connecting paths are provided to each of the plurality of secondary paths 21. Each of the first connecting path has a diverging path that breaks off or diverges away from the straight line portion of the second primary path 23 and that is connected to a straight line portion extending away from the primary path 20, and a converging path which joins or merges with the second primary path 23 from an end portion of the straight line portion extending toward the primary path 20. And the diverging location of the diverging path from the second primary path 23 is located on the upstream side in the travel direction of the article transport vehicle 3 with respect to the converging or merging location of the converging path. When a article transport vehicle 3 switches paths (or diverges) from the second primary path 23 to a secondary path 21, it continues to travel along the secondary path 21 in the same travel direction as it did in the second primary path 23. And, when the article transport vehicle 3 travels and switches paths from the secondary path 21 to the second primary path 23, it continues to travel along the second primary path 23 in the same travel direction as it did in the secondary path 21.

The locations of the storage station 24, the first shortcut paths 25, and the second shortcut paths 26 are between locations of the secondary paths 21 along the travel direction of the article transport vehicle 3 in the straight line portions in each of the first primary path 22 and the second primary paths 23. The storage stations 24 are arranged in all spaces defined between the locations of the secondary paths 21 as well as outside spaces defined between the locations of the secondary paths 21. The first shortcut path 25 is provided in one space defined between the locations of two adjacent secondary paths 21. The second shortcut paths 26 are arranged in each of the spaces defined between the locations of any two adjacent pair of secondary paths 21.

In the present article transport facility, to allow the article transport vehicles 3 to travel from a secondary path 21 located on one side of the primary path 20 to a secondary path 21 located on the other side of the primary path 20 without having to travel on or along the primary path 20, second connecting paths 27 are provided independently of the first connecting paths, with each of the second connecting paths 27 connecting the secondary paths 21 on one side and the secondary path 21 on the other side of the primary path 20.

[The Second Connecting Path]

Each second connecting path 27 has one end portion connected to the secondary path 21 located on one side of the primary path 20, other end portion connected to the secondary path 21 on the other side of the primary path 20, and an intermediate portion crossing the primary path 20. Each second connecting path 27 includes paths, each of which extends in a straight line, and which connect the secondary paths 21 that oppose or face each other with the primary path 20 therebetween.

Two of the second connecting paths 27 are provided to connect the identical secondary paths 21 to each other. Accordingly, one of the two second connecting paths 27 may define a path for the article transport vehicle 3 to travel from the secondary path 21 on one side (for example, left hand side in FIG. 1), with respect to the primary path 20, to the secondary path 21 on the other side (for example, right hand side in FIG. 1), while the other of the two may be a path for the article transport vehicle 3 to travel from the secondary path 21 on the other side (for example, right hand side in FIG. 1) to the secondary path 21 on the one side (for example, left hand side in FIG. 1) with respect to the primary path 20. Each of the two second connecting paths 27 that connects the identical secondary paths 21 has its leading end side connected to an end portion of the straight line portion, of the secondary path 21 on one side, which extends toward the primary path 20, and its terminating end side connected to a beginning portion of the straight line portion, of the secondary path 21 on the other side, which extends away from the primary path 20. As shown by the dashed arrows in FIG. 1, when an article transport vehicle 3 travels from the secondary path 21 on one side to the secondary path 21 on the other side along the second connecting path 27, because the travel direction in the secondary path 21 on the one side, the travel direction in the second connecting path 27, and the travel direction in the secondary path 21 on the other side are all the same, and because the portions of these plurality of paths are on the same straight line, an article transport vehicle 3 can travel smoothly from the secondary path 21 on one side to the secondary path 21 on the other side through and along the second connecting path 27.

Each of the connecting path 27 crosses or intersects perpendicularly with each of the straight line portion of the first primary path 22, and the straight line portion of the second primary path 23. The connecting locations of each of the straight line portions of the second connecting paths 27 with the first primary path 22 and the straight line portion of the second primary path 23 serve as crossing portions K.

The second connecting path 27 has two crossing portions K with the first primary path 22 and a converging path, which joins or merges the second connecting path 27 with the first primary path 22, is connected to a neighboring area of each the two crossing portions K. Thus, the second connecting path 27 allows the article transport vehicles 3 to switch paths to and diverge away from the first primary path 22. Therefore, the second connecting paths 27 allows the article transport vehicles 3 not only to travel from the secondary path 21 on the one side to the secondary path 21 on the other side with respect to the primary path 20, but also to travel from a secondary path 21 to the first primary path 22 without having to travel through the second primary path 23.

A diverging path which diverges or breaks away from a second primary path 23 is connected to the second connecting path 27, and also serves as a part of diverging paths for allowing the article transport vehicles 3 to switch paths and diverge from the second primary path 23 to the secondary path 21. A converging path which merges with the second primary path 23 is connected to the second connecting path 27, and also serves a part of converging paths for allowing the article transport vehicles 3 to switch paths to a second primary path 23 from the secondary path 21. This construction allows a part of paths which connect the second primary path 23 with the secondary paths 21 can be formed as common paths, thus simplifying the configuration of the system.

With regard to management of travel of the plurality of article transport vehicles 3, a facility management computer is provided to manage the operation of the plurality of movable bodies or the vehicles 3 over the entire travel path S. A carriage-side controller is provided to each of the article transport vehicles 3 to control the operation of the article transport vehicles 3 based on the operation command information from the facility management computer. The computer and the controller are of the conventional technology, and include a CPU, memory, communication units, etc. as well as algorithms stored in the memory for carrying out the functions described in this specification.

While not shown, each article transport vehicle 3 has various sensors, such as, a stop plate detection sensor which detects stop plates which are installed, for example, on the side of the travel rail 2 etc. and each of which shows the target stop position corresponding to each station 8 or the storage station 24, an absolute position plate detection sensor which detects the absolute position plates which indicate the position (or distance) from a reference point of the travel path S and which are installed on the side of the travel rail 2 etc., and a distance sensor which detects the distance covered by the article transport vehicle 3. The carriage-side controller determines the current position of the article transport vehicle 3 in the travel path S based on the detected information from the absolute position plate detection sensor, and on the detected information from the distance sensor after detecting the absolute position plate detection sensor, and transmits the current position information, and carriage discrimination information including the carriage number which can be used to identify the vehicle among the plurality of article transport vehicles 3, to the facility management computer through, for example, wireless communication.

The facility management computer manages operation of the plurality of article transport vehicles 3 based on the current position information from each carriage-side controller, and the carriage discrimination information while keeping track of each current position of the plurality of article transport vehicles 3. The facility management computer is configured to select one article transport vehicle 3 for transporting from among the plurality of article transport vehicles 3, and to provide a transporting command as an operation command information to the selected article transport vehicle 3 for transporting an article 4 from the original station 8 or storage station 24 (the term original is used to indicate a station which an article is fetched and delivered from) to the target station 8 or storage station 24 by specifying the original station 8 or storage station 24 and the target station 8 or storage station 24 among the plurality of stations 8 or the storage stations 24. In addition, when moving an article transport vehicle 3 from an original station to a target or destination station, the facility management computer is configured, for example, to select from a plurality of paths the shortest path in which distance covered is the shortest, and to issue a command information to command the article transport vehicle 3 to travel along the selected shortest path.

Thus, the carriage-side controller of the article transport vehicle 3, upon receiving the transporting command, controls the travel of the article transport vehicle 3 to travel to the specified original station 8 or the storage station 24 based on the detected information from various sensors, and to receive an article 4 from the original station 8 or storage station 24 by controlling the raising and lowering operation of the grip portion 6, and the switching operation of the grip portion 6. Thereafter, the carriage-side controller controls the travel of the article transport vehicle 3 to travel to the specified target station 8 or storage station 24 based on the detected information from various sensors and to unload the article 4 to the station 8 or storage station 24.

As shown in FIG. 1, the facility is provided with a plurality of diverging portions B (for example, portions enclosed by a dashed circle) for diverging or breaking away from a certain path to another path, a plurality of converging portions G (for example, portions enclosed by a dashed circle) for switching paths from a certain path to another path, and a plurality of crossing portions K (for example, portions enclosed by a dashed circle) where a certain path intersects another path perpendicularly. The operations of the article transport vehicles 3 on the travel path S are basically managed by the facility management computer as described above. However, for each of the diverging portion B, the converging portions G, and the crossing portions K, an operation managing device which manages operation of the article transport vehicle 3 is provided independently of the facility management computer to allow the article transport vehicles 3 to travel while preventing collisions between the article transport vehicles 3.

Diverging portions B include, for example, diverging portions B for diverging from the second primary path 23 to a secondary path 21, diverging portions B for diverging from the first primary path 22 to a first shortcut path 25, and diverging portions for diverging from the second primary path 23 to a second shortcut path 26. The converging portions G include, for example, converging portions G for merging (or converging) or switching paths from a secondary path 21 to the second primary path 23, converging portions G for switching paths from the second connecting path 27 to the first primary path 22, converging portions G for switching paths from a first shortcut path 25 to the first primary path 22, and converging portions G for switching paths from a second shortcut path 26 to the first primary path 22. The crossing portions K include the crossing portions K where a second connecting path 27 and the second primary path 23 intersect, and the crossing portions K where a second connecting path 27 and the first primary path 22 intersect.

Before advancing into a diverging portion B, a converging portion G, or a crossing portion K, the carriage-side controller of the article transport vehicle 3 inquires the operation managing device whether the advance into the portion is permitted, and controls travel of the article transport vehicle 3 to advance into the diverging portion B, the converging portion G, or the crossing portion K, only when a permission to do so is given. On the other hand, when the operation managing device receives an inquiry from the carriage-side controller as to if the advance is permitted, it issues an operation command information to the carriage-side controller such that only one article transport vehicle 3 is permitted in the converging portion G and the crossing portion K, and issues an operation command information to the carriage-side controller at a diverging portion B to permit the advance on the condition that another article transport vehicle 3 does not exist after diverging.

[Diverging Portions]

At a diverging portion B, the travel path of the article transport vehicle 3 diverges into two paths, and may be switched between the two paths to determine which of the paths is to be taken. The configuration for switching between the two paths to select the path to travel along is described next. A diverging portion B for diverging from the second primary path 23 to a secondary path 21 is described as an example with reference to FIG. 4.

At the diverging portion B in which a path diverges from the second primary path 23 to the secondary path 21, the diverging portion is switched so that when the article transport vehicle 3 is to travel on the second primary path 23 as it was, it would travel on the path extending straight forward, and the diverging portion is switched so that when the vehicle 3 is to diverge from the second primary path 23 to the secondary path 21, it would travel on the path which veers to the right side in the drawing.

In addition to the travel rail 2, a diverging portion guide rail 30 for guiding guided rollers 29, which can rotate freely about a vertical axis provided in the upper portion of the article transport vehicle 3, is provided in the diverging portion B. The diverging portion guide rail 30 is provided with a surface facing one lateral direction and the other surface facing the other lateral direction of the article transport vehicle 3 as guide surfaces 31 for guiding the guided rollers 29 with the two guide surfaces facing the opposite directions to each other. And one of the two guide surfaces of the guide rail 30 is a straight forward guide surface 31a for guiding the article transport vehicle 3 into the straight path, and the other is a diverging guide surface 31b for guiding the article transport vehicle 3 into the diverging path.

The article transport vehicle 3 has guide surface switching means 32 for switching the guide surface for guiding the guided roller 2 between the straight forward guide surface 31a and the diverging guide surface 31b by changing the position of the guided roller 29 with respect to the diverging portion guide rail 30 in the lateral direction of the article transport vehicle 3. Two guided rollers 29 are provided to the article transport vehicle 3 with the two spaced apart in the fore and aft direction. And each of the pair of guided rollers 29 is located at the same location as the travel wheels 12 in the fore and aft direction of the article transport vehicle 3. The guide surface switching means 32 is provided to each of the pair of guided rollers 29.

Each of the pair of guide surface switching means 32 includes a pivot arm 34 which can be pivoted about a vertical axis by an actuator 33, such as a motor, a movable body 35 provided in the distal end portion of the pivot arm 34, and a movement guide 36 for guiding movement of the movable body 35 in the lateral direction of the article transport vehicle 3. And the guided roller 29 is rotatably supported to the distal end portion of the movable body 35 for rotation about a vertical axis. Each of the pair of guide surface switching means 32 is configured to change the position of the guided roller 29 to the left hand side or right hand side in the lateral direction of the article transport vehicle 3 by pivoting the pivot arm 34 by the actuator 33 and thereby to switch between one position in which the guided roller 29 is guided by the straight forward guide surface 31a of the diverging portion guide rail 30 and the other position in which the guided roller 29 is guided by the diverging guide surface 31b. FIG. 4 shows when the guide surface switching means 32 has switched to the state where the guided roller 29 is guided by the diverging guide surface 31b of the diverging portion guide rail 30. In FIG. 4, the dotted lines show the article transport vehicle 3 after taking the diverging path with the guided roller 29 guided by the diverging guide surface 31b.

[Converging Portions]

While not shown, in addition to the travel rail 2, a converging portion guide rail for guiding the guided roller 29 is provided to the converging portion G similar to the diverging portion B described above. The guide surface switching means 32 is configured to change the position of the guided roller 29 to the left hand side or right hand side in the lateral direction of the article transport vehicle 3 so that the guided roller 29 is guided by the converging portion guide rail and so that the article transport vehicle 3 may switch paths to a converging path.

[Crossing Portions]

A crossing portion K in a crossing portion switching facility will now be described using the crossing portion K of the first primary path 22 (the first path) and a second connecting path 27 (the second path) as an example with reference to FIGS. 5 and 6. Incidentally, in the crossing portion K between the second primary path 23 and a second connecting path 27, the second primary path 23 corresponds to the first path, and the second connecting path 27 corresponds to the second path.

In addition to the pair of travel rails 2, a crossing portion guide rail 41 (the guide rail) for guiding the guided roller 29 is provided to each of the primary path entrance portion 37 (the first entrance portion), of the first primary path 22, which is continuous with the crossing portion K, the primary path exit portion 38 (the first exit portion) which is continuous from the crossing portion K, the secondary path entrance portion 39 (the second entrance portion), of the second connecting path 27, which is continuous with the crossing portion K, and the secondary path exit portion 40 (the second exit portion) which is continues from the crossing portion K.

Hereafter, the travel rail 2 provided in the areas of the primary path entrance portion 37 and the primary path exit portion 38 will be referred to as the primary travel rail 2*a*, and the travel rail 2 provided in the areas of the secondary path entrance portion 39 and the secondary path exit portion 40 will be referred to as the secondary travel rail 2*b*. And, the crossing portion guide rail 41 provided in the areas of the primary path entrance portion 37 and the primary path exit portion 38 will be referred to as the primary crossing portion guide rail 41*a*, and will be referred to as the secondary crossing portion guide rail 41*b* when provided in the areas of the secondary path entrance portion 39 and the secondary path exit portion 40.

In the crossing portion K, a rotatable travel rail 44 (switching rail) is provided, which can rotate about a vertical axis between a first travel position (see FIG. 5(*b*)) continuous with the primary travel rail 2*a* and a second travel position (see FIG. 5(*a*)) continuous with the secondary travel rail 2*b*. The rotatable travel rail 44 is configured such that the upper horizontal surface thereof guides and supports the travel wheels 12 similar to the travel rail 2, whereas its vertically-oriented side surface guides the travel guiding wheels 13. In each of the primary path entrance portion 37, the primary path exit portion 38, the secondary path entrance portion 39, and the secondary path exit portion 40, each of the pair of travel rails 2 support and guide each of the travel wheels 12 of the article transport vehicle 3. In contrast, in the crossing portion K, the rotatable travel rail 44 guides and support only one on one lateral side of each pair of travel wheels 12 of the article transport vehicle 3. That is, the rotatable travel rail 44 is provided only to one lateral side of the article transport vehicle 3, and is continuous only with one of the pair of primary travel rails 2*a* in the first travel position, and is continuous only with the one of the pair of secondary travel rails 2*b* in the second travel position.

The rotatable travel rail 44 has its end portion located such that it may be continuous with a terminating end portion of the primary travel rail 2*a*, and with a terminating end portion of the secondary travel rail 2*b*, and is configured to be pivotable between the first travel position and the second travel position with the end portion serving as a vertical axis 45. Accordingly, the rotatable travel rail 44 is configured to be switched between the first travel position and the second travel position with a pivoting of the rotatable travel rail 44 about the vertical axis 45.

In addition to the rotatable travel rail 44, a rotatable guide rail 42 (switching rail), which is rotatable about a vertical axis between a first guiding position (see FIG. 5(*b*)) continuous with the primary crossing portion guide rail 41*a*, and a second guiding position (see FIG. 5(*a*)) continuous with the secondary crossing portion guide rail 41*b*, is provided at each of the crossing portions K to guide the guided roller 29 arranged in an upper portion of the article transport vehicle 3.

FIG. 5(*b*) shows a state where the rotatable travel rail 44 is switched to the first travel position while the rotatable guide rail 42 is switched to the first guiding position. FIG. 5(*a*) shows a state where the rotatable travel rail 44 is switched to the second travel position while the rotatable guide rail 42 is switched to the second guiding position.

Each of the primary crossing portion guide rail 41*a*, the rotatable guide rail 42, and the secondary crossing portion guide rail 41*b* is provided at locations that correspond to a laterally central area of the article transport vehicle 3 passing through the crossing portion K to guide the guided roller 29 arranged in a laterally central location of the article transport vehicle 3. Each of the primary crossing portion guide rail 41*a*, the rotatable guide rail 42, and the secondary crossing portion guide rail 41*b*, includes a first guide surface 43*a* that faces one lateral direction of the article transport vehicle 3 passing through the crossing portion K, and a second guide surface 43*b* that faces the other lateral direction as guide surfaces 43 for guiding the guided roller 29.

And the rotatable guide rail 42 is configured to pivot between the first guiding position and the second guiding position about a vertical axis 46 located in the lengthwise central portion.

Switching of the rotatable travel rail 44 and of the rotatable guide rail 42 is performed at the crossing portion K by making use of the movement of the article transport vehicle 3 into the crossing portion K without the need to provide any actuator, such as an electric motor, in the crossing portion K.

The article transport vehicle 3 has a push operating portion 47 which is configured to push or press the rotatable guide rail 42 into rotating from the first guiding position to the second guiding position and from the second guiding position to the first guiding position with the movement of the article transport vehicle 3 into the crossing portion K. The push operating portion 47 may, for example, be a roller for pressing contact, which can rotate freely about a vertical axis, and which is arranged in the upper forward end portion of the article transport vehicle 3. Thus, the push operating portion 47 is configured to push the rotatable guide rail 42 as the article transport vehicle 3 advances into the crossing portion K, pivoting the rotatable guide rail 42 about the vertical axis by the pushing operation of the push operating portion 47 to switch between the first guiding position and the second guiding position.

An operatively connecting means 48 is provided at each of the crossing portions K for operatively connecting the rotatable guide rail 42 with the rotatable travel rail 44 such that rotation of one is transmitted to the other. The operatively connecting means 48 couples rotation of the rotatable guide rail 42 with rotation of the rotatable travel rail 44 so that the rotatable travel rail 44 is rotated from the first travel position to the second travel position as the rotatable guide rail 42 is rotated from the first guiding position to the second guiding position when pushed by the push operating portion 47. Similarly, the operatively connecting means 48 couples the rotation of the rotatable guide rail 42 with the rotation of the rotatable travel rail 44 so that the rotatable travel rail 44 is rotated from the second travel position to the first travel position as the rotatable guide rail 42 is rotated from the second guiding position to the first guiding position when pushed by the push operating portion 47.

As the article transport vehicle 3 advances into the crossing portion K, the rotatable guide rail 42 is pushed by the push operating portion 47 and pivoted about the vertical axis to be switched between the first guiding position and the second guiding position. Thus, as the rotatable guide rail 42 is switched, the operatively connecting means 48 transmits rotation of the rotatable guide rail 42 as rotation of the rotatable travel rail 44 and causes the rotatable travel rail 44 to switch between the first travel position and the second travel position.

Therefore, a switching means is configured to be switched between a first switching state where the rotatable guide rail 42 is in the first guiding position and the rotatable travel rail 44 is in the first travel position, and a second switching state where the rotatable guide rail 42 is in the second guiding position and the rotatable travel rail 44 is in the second travel position by means of the push operating portion 47 and the operatively connecting means 48.

Figure 6:
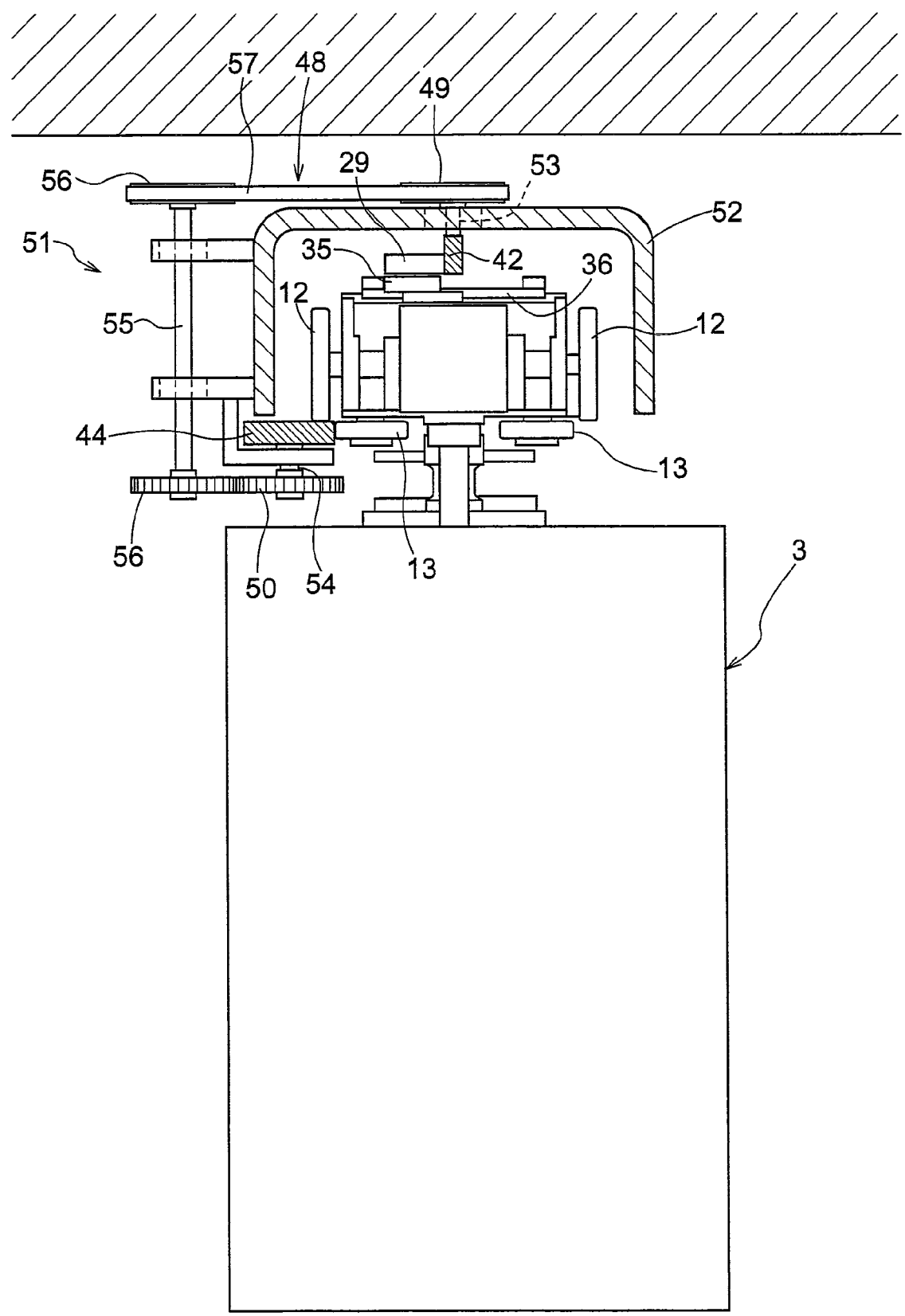
FIG. 6 is a sectional drawing showing the crossing portion as viewed in the travel direction.

As shown in FIG. 6, the operatively connecting means 48 may include a first rotating body 49 rotatable in unison with the rotatable guide rail 42 about a vertical axis, a second rotating body 49 rotatable in unison with the rotatable travel rail 44 about a vertical axis, and a rotation transmitting portion 51 for transmitting rotation of the first rotating body 49 to the second rotating body 50 to rotate the second rotating body 50.

The first rotating body 49 is provided to an upper portion of the rail support 52 which supports the rotatable guide rail 42 and the rotatable travel rail 44. And the rotatable guide rail 42 and the first rotating body 49 rotate in unison about a vertical axis by virtue of the fact that the vertical axis 46 of the rotatable guide rail 42 and the pivot axis of the first rotating body 49 are connected by the first connecting shaft 53.

The second rotating body 50 is arranged below the rotatable travel rail 44. And the rotatable travel rail 44 and the second rotating body 50 rotate in unison about a vertical axis by virtue of the fact that the vertical axis 45 of the rotatable travel rail 44 and the pivot axis of the second rotating body 50 are connected by the second connecting shaft 54.

The rotation transmitting portion 51 includes a pair of intermediate rotating bodies 56 arranged to be next to a lateral side of the rail support 52 and rotatable in unison about a vertical axis with respective pivot shafts connected to each other by an intermediate connecting shaft 55. The portion 51 thus transmits rotation of the first rotating body 49 to the intermediate rotating body 56 to rotate the intermediate rotating body 56, and transmits rotation of the intermediate rotating body 56 to the second rotating body 50 to rotate the second rotating body 50. The first rotating body 49 and the corresponding one of the intermediate rotating bodies 56 are timing pulleys. And the rotation of the first rotating body 49 is transmitted to the intermediate rotating body 56 by a timing belt 57 wound around the first rotating body 49 and the one of the intermediate rotating bodies 56. The second rotating body 50 and the other of the intermediate rotating bodies 56 are gears that mesh each other. And the rotation of the intermediate rotating body 56 is transmitted to the second rotating body 50 by the meshing engagement between the intermediate rotating body 56 and the second rotating body 50. It should be noted that the rotation of the intermediate rotating body 56 is reversed in direction as it is transmitted to the second rotating body 50.

When the rotatable guide rail 42 is rotated, the rotatable guide rail 42 and the first rotating body 49 rotate in unison, and the rotation of the first rotating body 49 is transmitted to one of the intermediate rotating bodies 56 via the timing belt 57 to rotate the intermediate rotating body 56. Since the pair of intermediate rotating bodies 56 rotate in unison, rotation of the intermediate rotating body 56 is transmitted to the second rotating body 50 to rotate it, and the second rotating body 50 and the rotatable travel rail 44 rotate in unison. In this manner, when the rotatable guide rail 42 is rotated from the first guiding position to the second guiding position, the rotatable travel rail 44 is caused to rotate from the first travel position to the second travel position. Conversely, when the rotatable guide rail 42 is rotated from the second guiding position to the first guiding position, the rotatable travel rail 44 is caused to rotate from the second travel position to the first travel position. The rotation of the intermediate rotating body 56 is reversed in direction as it is transmitted to the second rotating body 50. Thus, the operatively connecting means 48 couples the rotatable guide rail 42 with the rotation of the rotatable travel rail 44 such that the direction of rotation of the rotatable guide rail 42 is opposite from the direction of rotation of the rotatable travel rail 44.

[Passage of Article Transport Vehicle Through Crossing Portion]

Figure 7:
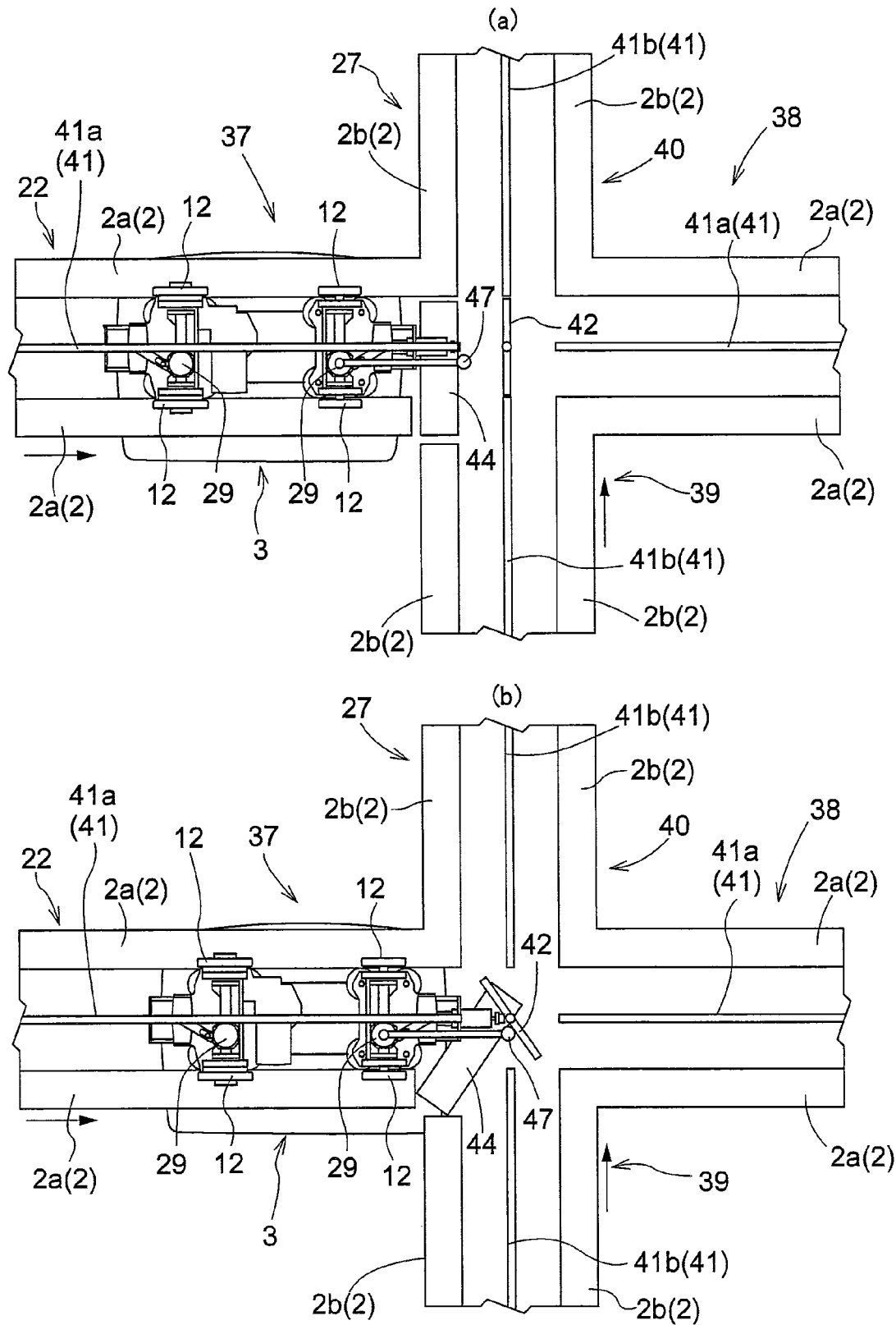
FIG. 7 shows an article transport vehicle passing through a crossing portion.

The operation of an article transport vehicle 3 when passing through a crossing portion K is described, taking a crossing portion K between a second connecting path 27 and the first primary path 22 as an example and with reference to FIGS. 7 and 8. FIGS. 7 and 8 basically show the case where the article transport vehicle 3 passes through the crossing portion K along the first primary path 22 while the dotted lines in FIG. 8(*b*) show the case where the article transport vehicle 3 passes through the crossing portion K along the second connecting path 27.

As shown in FIGS. 7(*a*) and 7(*b*), when the article transport vehicle 3 advances into the crossing portion K along the first primary path 22, the push operating portion 47 pushes the rotatable guide rail 42 as the article transport vehicle 3 advances into the crossing portion K. And the rotatable guide rail 42 starts to pivot from the second guiding position to the first guiding position in which it is continuous with the primary crossing portion guide rail 41*a*. Because of the coupling between the rotation of the rotatable guide rail 42 and the rotation of the rotatable travel rail 44 by the operatively connecting means 48, this causes the rotatable travel rail 44 to start pivoting from the second travel position to the first travel position in which it is continuous with the primary rail 2*a*. Since the push operating portion 47 is provided such as to project forward from the article transport vehicle 3, the push operating portion 47 pushes the rotatable guide rail 42, and the rotatable guide rail 42 starts to be pivoted from the second guiding position to the first guiding position in which the guide rail 42 is continuous with the primary crossing portion guide rail 41*a* while the article transport vehicle 3 is still traveling in the first entrance portion 39 and before reaching the crossing portion K.

As shown in FIG. 8(*a*), when the rotatable guide rail 42 is pushed and pivoted to the first guiding position by the push operating portion 47, the rotatable travel rail 44 is also pivoted to the first travel position because of the coupling between the rotation of the rotatable guide rail 42 and the rotation of the rotatable travel rail 44 by the operatively connecting means 48. As described above, because the rotatable guide rail 42 starts to be pivoted while the article transport vehicle 3 is still traveling in the first entrance portion 39 and before reaching the crossing portion K, the rotatable guide rail 42 will have been pivoted to the first guiding position by the time the article transport vehicle 3 reaches the crossing portion K. Thus the article transport vehicle 3 can pass through the crossing portion K with one of the travel wheels 12 supported by the rotatable travel rail 44, and with the guided roller 29 guided by the rotatable guide rail 42. And because the travel guiding wheel 13 of the article transport vehicle 3 is guided by the rotatable travel rail 44, the travel guiding wheel 13 presses down on the rotatable travel rail 44 while the article transport vehicle 3 is traveling through the crossing portion K. As a result, the rotatable travel rail 44 can thus be maintained in the first travel position. And, by fixing the position of the rotatable travel rail 44, the rotatable guide rail 42 may be maintained in the first guiding position.

A front pair and a back pair of travel wheels 12, a front group and a back group of the travel guiding wheels 13, and a front and back guided rollers 29 are provided such that the front travel or guiding wheels and the back travel or guiding wheels are spaced apart in the fore and aft direction of the article transport vehicle 3 and such that the front (back) travel wheels 12, the front (back) travel guiding wheels 13, and the front (back) guided roller 29 are located approximately at the same location in the fore and aft direction. This causes the moment at which the guided roller 29 and the rotatable guide rail 42 contact each other, and the moment at which the travel guiding wheel 13 and the rotatable travel rail 44 contact each other to occur approximately at the same time. This causes the force, caused by the contact between the guided roller 29 and the rotatable guide rail 42, that presses down on the rotatable guide rail 42 and the force, caused by the contact between the travel guiding wheel 13 and the rotatable travel rail 44, that presses down on the rotatable travel rail 44 to apply approximately at the same time. And in addition to the fact that such forces are applied at the same time, because the direction of rotation of the rotatable guide rail 42 and the direction of rotation of the rotatable travel rail 44 are opposite to each other, the rotatable travel rail 44 can be reliably maintained in the first travel position, and the rotatable guide rail 42 can also be reliably maintained in the first guiding position.

And, for example, the spacing in the fore and aft direction of the article transport vehicle 3 between the guided roller 29 in the front and the guided roller 29 in the rear is shorter than the length of the rotatable travel rail 44; thus, when each of the travel guiding wheels 13 arranged in front moves away from the rotatable travel rail 44, the travel guiding wheels 13 arranged in the back come into contact with the rotatable travel rail 44. This allows the article transport vehicle 3 to pass through the crossing portion K with the guided roller 29 and the rotatable guide rail 42 in contact with each other.

Thus, as shown in FIG. 8(*b*), the article transport vehicle 3 can pass through the crossing portion K along the first primary path 22.

As the article transport vehicle 3 advances into the crossing portion K, the push operating portion 47 provided to the article transport vehicle 3 pushes the rotatable guide rail 42. The rotatable guide rail 42 pivots from the first guiding position continuous with the primary crossing portion guide rail 41*a* to the second guiding position continuous with the secondary crossing portion guide rail 41*b*, and vice versa, about a vertical axis 46 located in a lengthwise central part of the rotatable guide rail 42. Therefore, the direction of rotation of the rotatable guide rail 42 when pivoting from the first guiding position to the second guiding position is opposite from the direction of rotation when pivoting from the second guiding position to the first guiding position. Therefore, when the article transport vehicle 3 passes through the crossing portion K, it is necessary to reverse the direction of rotation of the rotatable guide rail 42 when passing along the first primary path with respect to the direction of the rotation of the rotatable guide rail 42 when passing along the second connecting path 27, by changing the position of the push operating portion 47 in the lateral direction of the article transport vehicle 3.

Accordingly, the article transport vehicle 3 is provided with means 58 (see FIG. 4) for changing the position of the push operating portion 47 laterally between a first pushing position and a second pushing position. As shown in FIG. 7(*a*), the first pushing position is a position closer to one end in the lateral direction of the article transport vehicle 3 with respect to the lengthwise central part of the rotatable guide rail 42, and is such a position to pivot the rotatable guide rail 42 from the second guiding position to the first guiding position. As shown in dotted lines in FIG. 8(*b*), the second pushing position is a position closer to one end in the lateral direction of the article transport vehicle 3 with respect to the lengthwise central part of the rotatable guide rail 42, and is such a position to pivot the rotatable guide rail 42 from the first guiding position to the second guiding position.

As shown in FIG. 7(*a*), when the article transport vehicle 3 passes through the crossing portion K along the first primary path 22, the push operating portion position changing means 58 changes the position of the push operating portion 47 to the first pushing position (to the right as seen in the travel direction of the article transport vehicle 3). And, as shown in dotted lines in FIG. 8(*b*), when the article transport vehicle 3 passes through the crossing portion K along the second connecting path 27, the push operating portion position changing means 58 changes the position of the push operating portion 47 to the second pushing position (to the left as seen in the travel direction of the article transport vehicle 3).

When the article transport vehicle 3 passes through the crossing portion K, the guide surface switching means 32 (see FIG. 4) provided to the article transport vehicle 3 is configured to change the position of the guided roller 29 either to the right or left in the lateral direction of the article transport vehicle 3 with respect to each of the primary crossing portion guide rail 41*a*, the rotatable guide rail 42, and the secondary crossing portion guide rail 41*b*. Thus, the guide surface switching means 32 is configured to switch between the first guide surface 43*a* and the second guide surface 43*b* as the guide surface for guiding the guided roller 29 when the article transport vehicle 3 passes through the crossing portion K.

And the guide surface switching means 32 changes the position of the guided roller 29 such that the surface facing the direction opposite to the side the rotatable travel rail does not exist is the guide surface for guiding the guided roller 29. That is, as shown in FIG. 8(*a*), since the rotatable travel rail 44 is switched to the first travel position continuous with the primary rail 2*a* when the article transport vehicle 3 passes through the crossing portion K along the first primary path 22, the rotatable travel rail 44 is located to the right as viewed in the travel direction of the article transport vehicle 3. Accordingly, as shown in FIG. 7(*a*), the guide surface switching means 32 changes the position of the guided roller 29 to the right with respect to each of the primary crossing portion guide rail 41*a*, the rotatable guide rail 42, and the secondary crossing portion guide rail 41*b*, so that the first guide surface 43*a* facing the direction opposite to the side the rotatable travel rail does not exist is the guide surface for guiding the guided roller 29. As shown in FIG. 8(*b*), when the article transport vehicle 3 crosses the crossing portion K along the second connecting path 27, the guide surface switching means 32 changes the position of the guided roller 29 to the left with respect to each of the primary crossing portion guide rail 41*a*, the rotatable guide rail 42, and the secondary crossing portion guide rail 41*b*, so that the second guide surface 43b facing the direction opposite to the side the rotatable travel rail does not exist is the guide surface for guiding the guided roller 29.

As described above, the position of the push operating portion 47 in the lateral direction of the article transport vehicle 3 may be changed by the push operating portion position changing means 58 whereas the position of the guided roller 29 in the lateral direction of the article transport vehicle 3 may be changed by the guide surface switching means 32. Thus, the push operating portion 47 is connected to and supported by the guided roller 29 with the connecting body 59 and is configured to move in unison with the guided roller 29 in the lateral direction of the article transport vehicle 3. Thus, the push operating portion position changing means 58 is the guide surface switching means 32 so that there is no need to provide the actuator for the changing means 58.

Alternative Embodiments (1) Although a front guided roller and a rear guide roller 29 which are spaced apart in the fore and aft direction of the article transport vehicle 3 are provided in the embodiment described above, an additional guided roller 29 may be provided, for example, in a lengthwise intermediate position of the article transport vehicle 3 and between the existing pair of the guided rollers 29. This allows the guided rollers 29 and the rotatable guide rail 42 to stay in contact for a longer period of time, resulting in even more stable travel of the article transport vehicle 3 when passing through the crossing portion K. In addition, by providing an additional guided roller 29 in a lengthwise intermediate position between the front and back pair of guided rollers 29, a stable travel of the article transport vehicle is ensured when passing through the crossing portion K even if the vehicle 3 is long in the fore and aft direction.

(2) Although the rotatable travel rail 44 guides and supports, in each of the first travel position and the second travel position, one travel wheel 12 out of the travel wheels 12 located on both lateral sides of the article transport vehicle 3 in the embodiment described above, it is possible to provide a pair of rotatable travel rails 44, each of which is continuous with corresponding one of the pair of travel rails 2a and 2b to guide and support the travel wheels 12 arranged on both sides in the lateral direction of the article transport vehicle 3.

(3) In the embodiment described above, the operatively connecting means 48 may be configured to couple rotation of the rotatable guide rail 42 with rotation of the rotatable travel rail 44 such that the direction of rotation of the rotatable guide rail 42 and the direction of rotation of the rotatable travel rail 44 are the same. And, it would be clear to a person skilled in the art that the number and locations of the component parts for the operatively connecting means 48, such as gears, the belt, the shaft, and the pulley(s) may be changed. Not all of these component parts are required. For example, it is possible to use a plurality of meshing gears instead of the belt, and to use a belt and a pulley in place of the gear and a shaft. Also, it is not necessary to use a timing belt as a belt.

(4) In the embodiment described above, the push operating portion may be configured to push and rotate the rotatable travel rail 44 from the first travel position to the second travel position and from the second travel position to the first travel position as the article transport vehicle 3 advances into the crossing portion K. In this case, the operatively connecting means couples a rotation of the rotatable guide rail with a rotation of the rotatable travel rail such that when the rotatable travel rail 44 is pushed by the push operating portion and rotated from the first travel position to the second travel position, the rotatable guide rail 42 is rotated from the first guiding position to the second guiding position, and such that when the rotatable travel rail 44 is pushed by the push operating portion and rotated from the second travel position to the first travel position, the rotatable guide rail is rotated from the second guiding position to the first guiding position.

In addition, it is not necessary to provide the push operating portion with a roller. In place of the structure for sliding the push operating portion in the lateral direction of the article transport vehicle as a structure for the push operating portion position changing means, it is possible to use a structure to rotate the proximal end side of the push operating portion by means of an electric motor etc., to move the distal end of the push operating portion in the lateral direction. It is also possible to use any other known technology to move the distal end laterally for this purpose.

What is claimed is:

1. A switching facility for crossed paths comprising:
a first path;
a second path that crosses the first path in a crossing area;
at least one article transport vehicle configured to travel along the first path and the second path, each of the at least one of the article transport vehicle having:
a guided roller provided to an upper portion of the article transport vehicle to be rotatable about an axis extending in a vertical direction of the article transport vehicle;
travel wheels provided to a lower portion of the article transport vehicle to be rotatable about an axis extending in a lateral direction of the article transport vehicle;
a guide rail for guiding the guided roller of the article transport vehicle;
a travel rail for supporting and guiding the travel wheels of the article transport vehicle, wherein the guide rail and the travel rail are provided in each of a first entrance area and a first exit area of the first path, and a second entrance area and a second exit area of the second path, each of the first entrance area, the first exit area, the second entrance area, and the second exit area being continuous with the crossing area;
a rotatable guide rail located in the crossing area and rotatable about a vertical axis between a first position for guiding in which the rotatable guide rail is continuous with the guide rails provided in the first entrance area and the first exit area, and a second position for guiding in which the rotatable guide rail is continuous with the guide rails provided in the second entrance area and the second exit area;
a rotatable travel rail located in the crossing area and rotatable about a vertical axis between a first position for travel in which the rotatable travel rail is continuous with the travel rails provided in the first entrance area and the first exit area, and a second position for travel in which the rotatable travel rail is continuous with the travel rails provided in the second entrance area and the second exit area;
a push operating portion provided to each of the article transport vehicle and configured to push one of the rotatable guide rail and the rotatable travel rail from the first position into the second position, and from the second position into the first position as the article transport vehicle advances into the crossing area,
operatively connecting means for coupling a rotation of the rotatable guide rail with a rotation of the rotatable travel rail such that when one of the rotatable guide rail and the rotatable travel rail is pushed by the push operating portion and rotated from the first position to the second position, the other of the rotatable guide rail and the rotatable travel rail is rotated from the first position to the second position, and such that when one of the rotatable guide rail and the rotatable travel rail is pushed by the push operating portion and rotated from the second position to the first position, the other of the rotatable guide rail and the rotatable travel rail is rotated from the second position to the first position.

2. A switching facility for crossed paths as defined in claim 1, wherein the push operating portion is configured to push the rotatable travel rail from the first position for guiding to the second position for guiding, and from the second position for guiding to the first position for guiding as the article transport vehicle advances into the crossing area, and the operatively connecting means couples a rotation of the rotatable guide rail with a rotation of the rotatable travel rail such that when the rotatable guide rail is pushed by the push operating portion and rotated from the first position for guiding to the second position for guiding, the rotatable travel rail is rotated from the first position for travel to the second position for travel, and such that when the rotatable guide rail is pushed by the push operating portion and rotated from the second position for guiding to the first position for guiding, the rotatable travel rail is rotated from the second position for travel to the first position for travel.

3. A switching facility for crossed paths as defined in claim 2, wherein the article transport vehicle has a travel guiding wheel rotatable about a vertical axis and provided to a lower portion of the article transport vehicle, and wherein the rotatable travel rail is configured to guide and support the travel wheels with a horizontal surface and to guide the travel guiding wheel with a vertical surface.

4. A switching facility for crossed paths as defined in claim 2, wherein the operatively connecting means couples a rotation of the rotatable guide rail with a rotation of the rotatable travel rail such that a direction of rotation of the rotatable guide rail and a direction of rotation of the rotatable travel rail are opposite to each other.

5. A switching facility for crossed paths as defined in claim 2, wherein the operatively connecting means includes a first rotating body configured to rotate in unison with the rotatable guide rail about a vertical axis, a second rotating body configured to rotate in unison with the rotatable travel rail about a vertical axis, and a rotation transmitting portion which transmits rotation of the first rotating body to the second rotating body to rotate the second rotating body.

6. A switching facility for crossed paths as defined in claim 2, wherein the rotatable guide rail is configured to pivot about a vertical axis from the first position for guiding to the second position for guiding and from the second position for guiding to the first position for guiding, wherein the travel rails are provided on both lateral sides of the article transport vehicle to guide and support each of the travel wheel located on one lateral side and the travel wheel located on the other lateral side of the article transport vehicle, wherein the rotatable travel rail is located at such a position that an end portion thereof is continuous with a terminating end portion of a pair of the travel rails in the first entrance area and with a terminating end portion of a pair of the travel rails in the second entrance area, and wherein the rotatable travel rail is configured to pivot between the first position for travel and the second position for travel with a vertical axis of rotation located in the end portion.

7. A switching facility for crossed paths as defined in claim 6, wherein

The guide rail and the rotatable guide rail are located in a central area in a lateral direction of the article transport vehicle so as to guide the guided roller located in the central area in the lateral direction when the article transport vehicle passes through the crossing area, wherein the rotatable guide rail is configured to pivot about a vertical axis located in a central area of the rotatable guide rail, and wherein the article transport vehicle includes push operating portion position changing means for changing a position of the push operating portion in the lateral direction between a first pushing position which is closer to one end in the lateral direction with respect to a central area of the rotatable guide rail in the lateral direction, and which is such a position to pivot the rotatable guide rail from the second position for guiding to the first position for guiding, and the second pushing position which is closer to the other end in the lateral direction with respect to a central area of the rotatable guide rail in the lateral direction, and which is such a position to pivot the rotatable guide rail from the first position for guiding to the second position for guiding.

8. A switching facility for crossed paths as defined in claim 7, wherein the rotatable travel rail is configured to guide and support one of the travel wheels arranged on both sides in the lateral direction in each of the first position for travel and the second position for travel, wherein each of the guide rail and the rotatable guide rail includes a surface which faces one lateral direction, and a surface which faces the other lateral direction opposite the one lateral direction as guide surfaces for guiding the guided roller, wherein the article transport vehicle has guide surface switching means for changing a position of the guided roller in the lateral direction with respect to the guide rail and the rotatable guide rail to switch between the surface, of the guide rail and the rotatable guide rail, which faces one lateral direction and the surface which faces the other lateral direction as a surface for guiding the guided roller when the article transport vehicle passes through the crossing area.

9. A switching facility for crossed paths as defined in claim 8, wherein the push operating portion is configured to move in unison with the guided roller in the lateral direction, and the push operating portion position changing means includes the guide surface switching means.

* * * * *